United States Patent [19]
Han et al.

[11] Patent Number: 5,821,152
[45] Date of Patent: Oct. 13, 1998

[54] METHODS OF FORMING HEMISPHERICAL GRAINED SILICON ELECTRODES INCLUDING MULTIPLE TEMPERATURE STEPS

[75] Inventors: Chan-hee Han; Chang-jip Yang, both of Kyungki-do; Young-kyou Park; Jae-wook Kim, both of Seoul, all of Rep. of Korea

[73] Assignee: Samsung Electronics Co., Ltd., Kyungki-do, Rep. of Korea

[21] Appl. No.: 950,962

[22] Filed: Oct. 15, 1997

[30]    Foreign Application Priority Data

May 21, 1997 [KR]  Rep. of Korea ................. 1997-19862

[51] Int. Cl.$^6$ .................................................. H01L 21/20
[52] U.S. Cl. ............................................ 438/398; 438/255
[58] Field of Search .................................. 438/253, 255, 438/396, 398, 308

[56]            References Cited

U.S. PATENT DOCUMENTS

| | | | |
|---|---|---|---|
| 5,234,862 | 8/1993 | Aketagawa et al. | 437/103 |
| 5,366,917 | 11/1994 | Watanabe et al. | 437/47 |
| 5,372,962 | 12/1994 | Hirota et al. | 437/47 |
| 5,385,863 | 1/1995 | Tatsumi et al. | 437/109 |
| 5,394,012 | 2/1995 | Kimura | 257/739 |
| 5,405,801 | 4/1995 | Han et al. | 437/60 |
| 5,464,791 | 11/1995 | Hirota | 437/60 |
| 5,486,488 | 1/1996 | Kamiyama | 437/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,616,511 | 4/1997 | Hirota | 438/396 |
| 5,623,243 | 4/1997 | Watanabe et al. | 257/309 |
| 5,663,090 | 9/1997 | Dennison et al. | 438/398 |

FOREIGN PATENT DOCUMENTS 4-286151  10/1992  Japan .

OTHER PUBLICATIONS

H. Watanabe et al., *A New Cylindrical Capacitor Using Hemispherical Grained Si (HSG–Si) for 256Mb DRAMs*, 1992 IEEE, IEDM 92, 10.1.1—10.1.4, pp. 259–262.

*Primary Examiner*—Tuan H. Nguyen
*Attorney, Agent, or Firm*—Myers Bigel Sibley & Sajovec

[57]            ABSTRACT

A method of forming a hemispherical grained silicon electrode includes the steps of forming an amorphous silicon layer on an integrated circuit substrate, and heating the integrated circuit substrate and the amorphous silicon layer to a first deposition temperature. The amorphous silicon layer is exposed to a source gas including silicon while maintaining the first deposition temperature thereby forming silicon crystal nuclei on a surface of the amorphous silicon layer. The temperature of the integrated circuit substrate is lowered to a second deposition temperature wherein the second deposition temperature is less than the first deposition temperature. The silicon crystal nuclei are exposed to the source gas including silicon while maintaining the second deposition temperature thereby increasing a size of the silicon crystal nuclei. The silicon layer and the silicon crystal nuclei are then annealed thereby further increasing the size of the silicon crystal nuclei to provide hemispherical grains on the silicon layer.

24 Claims, 3 Drawing Sheets

METHODS OF FORMING HEMISPHERICAL GRAINED SILICON ELECTRODES INCLUDING MULTIPLE TEMPERATURE STEPS

FIELD OF THE INVENTION

The present invention relates to the field of integrated circuits and more particularly to methods of forming hemispherical grained silicon electrodes.

BACKGROUND OF THE INVENTION

In a dynamic random access memory (DRAM) device, increasing the memory cell capacitance can improve the reading capacity of a memory cell and reduce a soft error rate thereof. The performance of a DRAM can thus be improved by increasing the memory cell capacitance. As memory devices become more highly integrated, however, the surface area of a substrate available for each memory cell is reduced thereby reducing the area available for each memory cell capacitor. Accordingly, there continues to exist a need in the art to provide increased memory cell capacitances with capacitors occupying smaller surface areas of a substrate.

Various efforts have thus been made to increase memory cell capacitances. Most of these efforts have been concentrated on increasing surface areas of the capacitor electrodes. For example, thin electrode structures, box electrode structures, and cylindrical electrode structures have been proposed. Increases in memory cell capacitances using these structures may, however, be difficult as a result of design rule limits and increases in soft error rates resulting from the more complicated manufacturing steps used.

SUMMARY OF THE INVENTION

It is therefore an object of the present invention to provide improved methods of forming hemispherical grained silicon electrodes.

It is another object of the present invention to provide methods of forming capacitors having increased capacitance.

It is still another object of the present invention to provide methods of forming hemispherical grained silicon electrodes having increased surface areas.

These and other objects are provided according to the present invention by methods including the steps of forming an amorphous silicon layer on an integrated circuit substrate, and heating the integrated circuit substrate and the amorphous silicon layer to a first deposition temperature. The amorphous silicon layer is exposed to a source gas including silicon while maintaining the first deposition temperature thereby forming silicon crystal nuclei on a surface of the amorphous silicon layer. The temperature of the substrate is lowered to a second deposition temperature wherein the second deposition temperature is less than the first deposition temperature, and the silicon crystal nuclei are exposed to the source gas including silicon while maintaining the second deposition temperature thereby increasing a size of the silicon crystal nuclei. The silicon layer and the silicon crystal nuclei are annealed thereby further increasing the size of the silicon crystal nuclei to thus provide hemispherical grains on the silicon layer.

Accordingly, the surface area of the hemispherical grained silicon electrode can be increased. More particularly, the use of two exposing steps to form the silicon crystal nuclei can increase the density of the silicon crystal nuclei. Accordingly, a capacitor can be completed by forming a dielectric layer on the silicon layer including the hemispherical grains and forming an electrode layer on the dielectric layer. Because the surface area of the electrode has been increased, the capacitance of the capacitor is also increased.

More particularly, the first deposition temperature can be in the range of 570° C. to 600° C., and the second deposition temperature can be in the range of 550° C. to 590° C. The annealing step can be performed at an annealing temperature that is no higher than the second deposition temperature. Moreover, the annealing step can be performed while lowering the temperature of the silicon layer from the second deposition temperature to the annealing temperature. The amorphous silicon layer can be converted to polycrystalline silicon after the first exposing step, the lowering step, the second exposing step, and the annealing step.

The lowering step can include exposing the amorphous silicon layer and the silicon crystal nuclei to the source gas including silicon. Moreover, the amorphous silicon layer can include a doped amorphous silicon layer. The heating step can include stabilizing an environment surrounding the integrated circuit substrate at the first temperature for a predetermined period of time prior to the first exposing step.

According to the methods of the present invention, a higher density of silicon crystal nuclei can be created thereby increasing the surface area of the resulting hemispherical grained silicon electrode.

DETAILED DESCRIPTION

Figure 1:
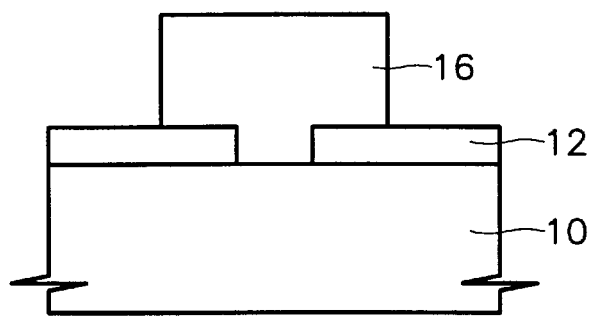
FIGS. 1 through 5 are cross-sectional views illustrating steps of a method of forming a hemispherical grained silicon electrode according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

A method according to the present invention will now be discussed with reference to FIGS. 1 through 5. As shown in FIG. 1, an amorphous silicon layer 16 is formed on a semiconductor substrate 10. More particularly, an insulating layer 12 such as a layer of silicon oxide is formed on the semiconductor substrate 10, and a contact hole is formed in the insulating layer 12 thereby exposing a portion of the substrate 10. The amorphous silicon layer 16 is formed on the insulating layer 12, and this amorphous silicon layer 16 is electrically coupled with the exposed portion of the substrate through the contact hole. An impurity such as fluorine is ion implanted into the amorphous silicon layer 16, and this doped amorphous silicon layer 16 is patterned to provide a lower capacitor electrode as shown in FIG. 1.

As will be understood by those having skill in the art, the silicon layer 16 can be used to provide a storage electrode for a memory cell capacitor. Moreover, a memory cell access transistor can be formed in the substrate 10 prior to forming the insulating layer 12, and the contact hole through the insulating layer 12 can be used to expose a source/drain region of the memory cell access transistor. Accordingly, the storage electrode can be electrically coupled with the source/drain region of the memory cell access transistor.

Figure 2:
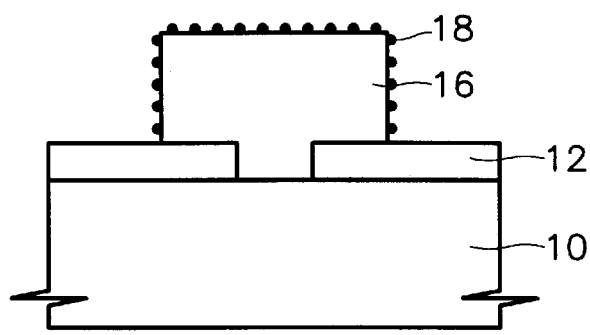

Silicon crystal nuclei 18 are formed on the amorphous silicon layer 16 as shown in FIG. 2. Moreover, the silicon crystal nuclei 18 can be formed during a seeding step. In particular, the semiconductor substrate 10 including the amorphous silicon layer 16 can be loaded into a chamber of a low pressure chemical vapor deposition (LPCVD) system. A silicon source gas such as silane ($SiH_4$) gas or disilane ($Si_2H_6$) gas can then be injected into the chamber at a first temperature in the range of 570° C. to 600° C. The first silicon crystal nuclei 18 are thus selectively formed on the amorphous silicon layer 16. The density of the silicon crystal nuclei 18 can be increased because the silicon crystal nuclei 18 are formed at a relatively high temperature. The silicon crystal nuclei 18 are selectively formed on the amorphous silicon layer 16 because of the difference in the incubation times of the amorphous silicon layer 16 and the insulating layer 12 during an initial silicon deposition stage. This difference in incubation times may be due to differences in the surface energies and surface states of the amorphous silicon layer 16 and the insulating layer 12.

Figure 3:
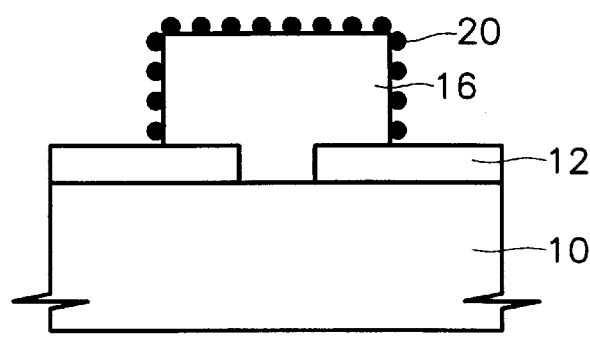

The silicon crystal nuclei 18 are grown to provide the larger silicon crystal nuclei 20 as shown in FIG. 3. In particular, a silicon source gas such as silane ($SiH_4$) gas or disilane ($Si_2H_6$) gas is injected into the chamber while lowering the temperature of the chamber to a second temperature lower than the first temperature. The second temperature can be in the range of 550° C. to 590° C. The silicon crystal nuclei 18 on the amorphous silicon layer 16 are thus enlarged to provide the larger silicon crystal nuclei 20.

Figure 4:
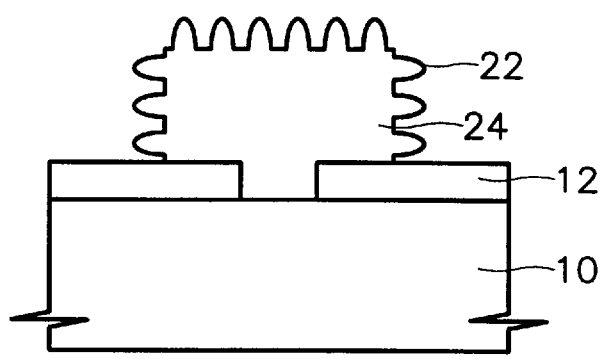

The amorphous silicon layer 16 and the larger silicon crystal nuclei 20 can then be converted to a polysilicon layer 24 having hemispherical grains 22 thereon as shown in FIG. 4. In particular, the larger silicon crystal nuclei 20 and the amorphous silicon layer 16 are annealed to further enlarge the silicon crystal nuclei 20. The hemispherical grains 22 are thus formed while concurrently recrystallizing the amorphous silicon layer 16. The second silicon crystal nuclei 20 grow by receiving silicon present in the amorphous silicon layer 16. The hemispherical grained silicon (HSG-Si) layer 24 having the hemispherical grains 22 are thus formed on the semiconductor substrate 10. This annealing step is performed at the second temperature or lower. This step can also be performed while lowering the temperature from the second temperature to a third temperature lower than the second temperature. Defects generated during the formation of the HSG-Si layer 24 can be reduced using these annealing temperatures, and the time necessary for growing the silicon crystal nuclei 20 can be increased.

The HSG-Si layer 24 can be obtained using a physical phenomena that occurs in the course of a phase transition of amorphous silicon to polysilicon. If the amorphous silicon is deposited on a substrate and heated, the amorphous silicon may undergo phase transition into intermediate polysilicon having an irregular surface by forming hemispherical micrograins. The area of this irregular surface may be two to three times that of the surface before the transition occurs. The HSG-Si layer 24 can thus be used as the lower electrode of a capacitor in a semiconductor device such as a dynamic random access memory device.

Figure 5:
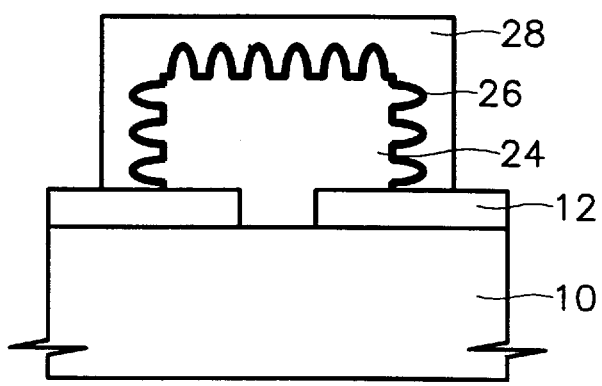

A dielectric layer 26 is formed on the HSG-Si layer 24, and a polysilicon layer 28 is formed on the dielectric layer as shown in FIG. 5. The dielectric layer 26 can be a nitride/oxide (NO) layer formed on the HSG-Si layer 24. A second capacitor electrode such as a doped polysilicon layer 28 can then be formed on the dielectric layer 26. The polysilicon layer 28 can be used as an upper electrode for the capacitor.

Figure 6:
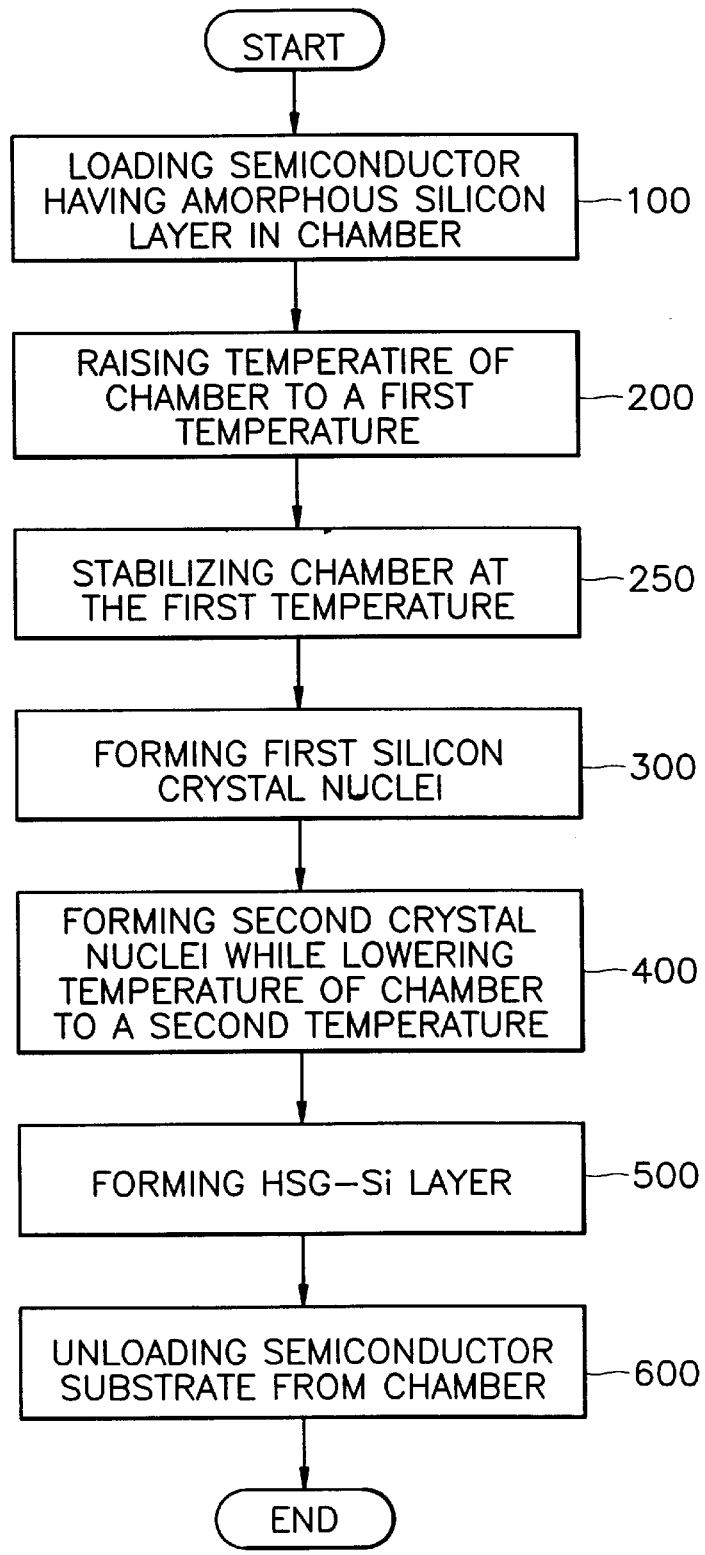
FIG. 6 is a flow chart illustrating a method of forming a hemispherical grained silicon electrode according to the present invention.

A method of forming the HSG-Si layer according to the present invention will now be discussed with reference to the flow chart of FIG. 6. A semiconductor substrate having a doped amorphous silicon layer is loaded into a reaction chamber and maintained at a temperature in the range of 400° C. to 500° C. The temperature of the chamber is raised to a first deposition temperature in the range of 570° C. to 600° C. at step 200. The temperature of the reaction chamber is then stabilized for a predetermined period of time at block 250.

A silicon source gas is then injected into the chamber so that silicon crystal nuclei are selectively formed on the amorphous silicon layer at block 300. The silicon crystal nuclei are grown by injecting the silicon source gas into the chamber while lowering the temperature of the chamber to a second temperature in the range of 550° C. to 590° C. at block 400.

The silicon crystal nuclei are grown again by annealing the substrate including the silicon crystal nuclei. At the same time, the amorphous silicon layer may recrystallize to form a polysilicon layer. More particularly, the annealing step is performed at the second temperature or a lower temperature. Alternately, the annealing step can be performed while lowering the temperature of the chamber from the second temperature to a third temperature lower than the second temperature. The polysilicon layer having hemispherical grains (HSG-Si) is thus formed on the substrate at block 500. The substrate is then unloaded from the chamber at block 600.

As discussed above, silicon crystal nuclei are formed using two steps thereby increasing the density of the silicon crystal nuclei to thus enhance the memory cell capacitance. In other words, the high density silicon nuclei are first formed at a higher temperature, and the silicon crystal nuclei are then grown to a larger size while lowering the temperature from the higher temperature to a lower temperature. The surface area of the polysilicon electrode can thus be increased due to the increased density of the silicon crystal nuclei. Accordingly, the memory cell capacitance can be increased.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a hemispherical grained silicon electrode, said method comprising the steps of:

forming an amorphous silicon layer on an integrated circuit substrate;

heating said integrated circuit substrate and said amorphous silicon layer to a first deposition temperature;

exposing said amorphous silicon layer to a source gas including silicon while maintaining said first deposition temperature thereby forming silicon crystal nuclei on a surface of said amorphous silicon layer;

lowering a temperature of said integrated circuit substrate, said amorphous silicon layer, and said silicon crystal nuclei to a second deposition temperature wherein said second deposition temperature is less than said first deposition temperature;

exposing said silicon crystal nuclei to said source gas including silicon while maintaining said second deposition temperature thereby increasing a size of said silicon crystal nuclei; and annealing said silicon layer and said silicon crystal nuclei after said step of exposing said silicon crystal nuclei thereby further increasing said size of said silicon crystal nuclei to provide hemispherical grains on said silicon layer.

2. A method according to claim 1 wherein said heating step, said first exposing step, said lowering step, said second exposing step, and said annealing step are followed by the steps of:

forming a dielectric layer on said silicon layer including said hemispherical grains; and forming an electrode layer on said dielectric layer.

3. A method according to claim 1 wherein said first deposition temperature is in the range of 570° C. to 600° C. and wherein said second deposition temperature is in the range of 550° C. to 590° C.

4. A method according to claim 1 wherein said second deposition temperature is in the range of 550° C. to 590° C.

5. A method according to claim 1 wherein said annealing step is performed at an annealing temperature, wherein said annealing temperature is no higher than said second deposition temperature.

6. A method according to claim 5 wherein said annealing step is performed while lowering said temperature of said silicon layer from said second deposition temperature to said annealing temperature.

7. A method according to claim 1 wherein said amorphous silicon layer is converted to polycrystalline silicon after said first exposing step, said lowering step, said second exposing step, and said annealing step.

8. A method according to claim 1 wherein said lowering step comprises exposing said amorphous silicon layer and said silicon crystal nuclei to said source gas including silicon.

9. A method according to claim 1 wherein said amorphous silicon layer comprises a doped amorphous silicon layer.

10. A method according to claim 1 wherein said heating step comprises stabilizing an environment surrounding said integrated circuit substrate at said first temperature for a predetermined period of time prior to said first exposing step.

11. A method of forming a hemispherical grained silicon electrode, said method comprising the steps of:

forming an amorphous silicon layer on an integrated circuit substrate;

heating said integrated circuit substrate and said amorphous silicon layer to a first deposition temperature;

exposing said amorphous silicon layer to a source gas including silicon while maintaining said first deposition temperature thereby forming silicon crystal nuclei on a surface of said amorphous silicon layer;

exposing said silicon crystal nuclei to said source gas including silicon while lowering said temperature of said silicon layer to a second deposition temperature less than said first deposition temperature and maintaining said temperature of said silicon layer at said second deposition temperature thereby increasing a size of said silicon crystal nuclei; and annealing said silicon layer and said silicon crystal nuclei after said second exposing step thereby further increasing said size of said silicon crystal nuclei to provide hemispherical grains on said silicon layer.

12. A method according to claim 11 wherein said heating step, said first and second exposing steps, and said annealing step are followed by the steps of:

forming a dielectric layer on said silicon layer including said hemispherical grains; and forming an electrode layer on said dielectric layer.

13. A method according to claim 11 wherein said first deposition temperature is in the range of 570° C. to 600° C. and wherein said second deposition temperature is in the range of 550° C. to 590° C.

14. A method according to claim 11 wherein said second deposition temperature is in the range of 550° C. to 590° C.

15. A method according to claim 11 wherein said annealing step is performed at an annealing temperature, and wherein said annealing temperature is no higher than said second deposition temperature.

16. A method according to claim 15 wherein said annealing step is performed while lowering said temperature of said silicon layer from said second deposition temperature to said annealing temperature.

17. A method according to claim 11 wherein said amorphous silicon layer is converted to polycrystalline silicon after said first and second exposing steps, and said annealing step.

18. A method according to claim 11 wherein said amorphous silicon layer comprises a doped amorphous silicon layer.

19. A method according to claim 11 wherein said heating step comprises stabilizing an environment surrounding said integrated circuit substrate at said first temperature for a predetermined period of time prior to said first exposing step.

20. A method of forming a hemispherical grained silicon electrode on an integrated circuit substrate, said method comprising the steps of:

exposing an amorphous silicon layer on the integrated circuit substrate to a source gas including silicon while maintaining said amorphous silicon layer at a first deposition temperature thereby forming silicon crystal nuclei on a surface of said amorphous silicon layer;

lowering a temperature of said integrated circuit substrate, said amorphous silicon layer, and said silicon crystal nuclei to a second deposition temperature wherein said second deposition temperature is less than said first deposition temperature; and exposing said silicon crystal nuclei to said source gas including silicon while maintaining silicon layer at said second deposition temperature lower that said first deposition temperature thereby increasing a size of said silicon crystal nuclei.

21. A method according to claim 20 further comprising the step of:

annealing said silicon layer and said silicon crystal nuclei after said step of exposing said silicon crystal nuclei thereby further increasing said size of said silicon crystal nuclei to provide hemispherical grains on said silicon layer.

22. A method according to claim 20 wherein said heating step, said first exposing step, said lowering step, said second exposing step, and said annealing step are followed by the steps of:

forming a dielectric layer on said silicon layer including said hemispherical grains; and forming an electrode layer on said dielectric layer.

23. A method according to claim 20 wherein said first deposition temperature is in the range of 570° C. to 600° C. and wherein said second deposition temperature is in the range of 550° C. to 590° C.

24. A method according to claim 20 wherein said second deposition temperature is in the range of 550° C. to 590° C.

* * * * *